(12) United States Patent
Balhiser

(10) Patent No.: US 6,351,171 B1
(45) Date of Patent: *Feb. 26, 2002

(54) ACCELERATED INTERCONNECT TRANSMISSION VIA VOLTAGE CLAMPING TOWARDS TOGGLE POINT

(75) Inventor: David D. Balhiser, Ft. Collins, CO (US)

(73) Assignee: Agilent Technologies, Inc., Palo Alto, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/178,724

(22) Filed: Oct. 26, 1998

(51) Int. Cl.[7] ................................................. H03K 5/08
(52) U.S. Cl. ........................ 327/318; 327/320; 327/321
(58) Field of Search ................................. 327/314, 318, 327/320, 321, 325, 570, 571, 572; 333/20, 34

(56) References Cited

U.S. PATENT DOCUMENTS

| | | | | |
|---|---|---|---|---|
| 3,453,447 A | * | 7/1969 | Campanella | 326/134 |
| 4,066,918 A | * | 1/1978 | Heuner et al. | 327/318 |
| 4,760,433 A | * | 7/1988 | Young et al. | 357/23.13 |
| 4,952,916 A | * | 8/1990 | Taplin | 340/686 |
| 5,444,751 A | * | 8/1995 | Sage | 327/570 |
| 5,525,933 A | * | 6/1996 | Matsuki et al. | 327/314 |
| 5,574,395 A | * | 11/1996 | Kusakabe | 327/314 |
| 5,656,873 A | * | 8/1997 | O'Loughlin et al. | 333/34 |
| 5,825,240 A | * | 10/1998 | Geis et al. | 327/570 |
| 5,880,621 A | * | 3/1999 | Ohashi | 327/314 |

OTHER PUBLICATIONS

Barna Arpad, and Porat, Dan I., "Integrated Circuits in Digital Electronics", John Wiley & Sons, New York (1973), ISBN 0-471-05050-4, pp. 120-121.

* cited by examiner

Primary Examiner—Timothy P. Callahan
Assistant Examiner—An T. Luu
(74) Attorney, Agent, or Firm—Alex J. Neudeck

(57) ABSTRACT

A method and apparatus for accelerating the transmission of signals across an interconnect wire of an integrated circuit is presented. According to the method, a minimum charge level is maintained on the wire when it is driven to a low voltage level and a maximum charge level is maintained on the wire when it is driven to a high voltage level. In accordance with the apparatus of the invention, the minimum and maximum charge levels are maintained on the wire using a pair of clamping circuits which clamp the voltage level on the receiving end of the wire to a respective minimum voltage level and maximum voltage level. Accordingly, when the interconnect wire is driven to a high voltage level at a driven end of the wire, the charge level on the receiving end of the wire is already at a minimum level, resulting in less delay time to charge the wire to a high voltage level. Conversely, when the interconnect wire is driven to a low voltage level at the driven end of the wire, the charge level on the receiving end of the wire is already capped to a maximum level, which results in less delay time to drain the wire to a low voltage level.

19 Claims, 7 Drawing Sheets

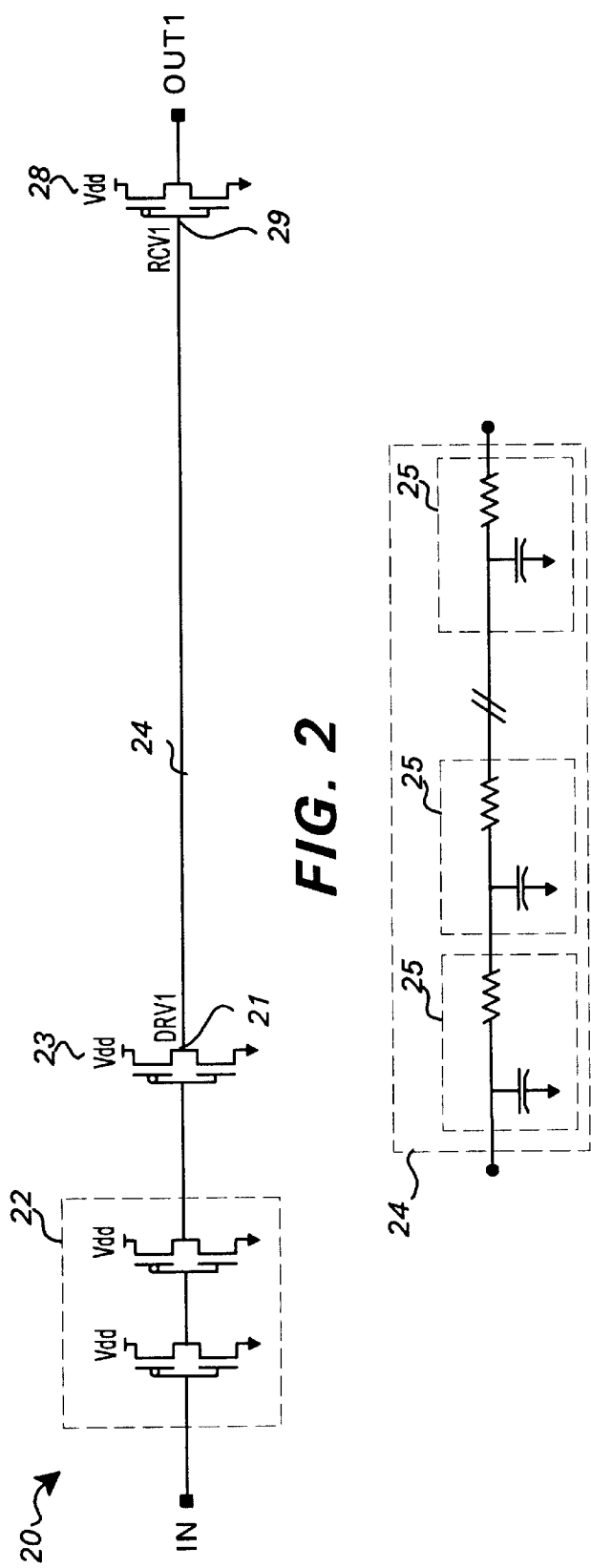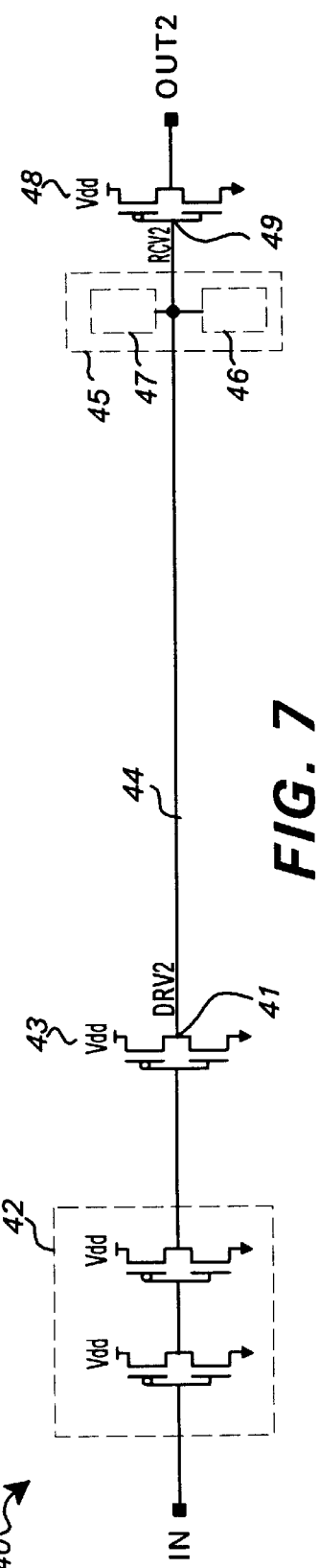

ACCELERATED INTERCONNECT TRANSMISSION VIA VOLTAGE CLAMPING TOWARDS TOGGLE POINT

FIELD OF THE INVENTION

The present invention pertains generally to integrated circuits, and more particularly to a method and apparatus for accelerating the transmission of signals over die interconnects in an integrated circuit via voltage clamping.

BACKGROUND OF THE INVENTION

The semiconductor industry continues to yield integrated circuits (ICs) of increasing density in order to reduce their overall required chip space and to increase the amount of functionality on a chip. At the same time, logic circuits continue to increase in speed via incremental improvements in component switching times. Even as the performance of electrical components in ICs are improved, however, the maximum achievable speed of the overall circuit still does not approach the achievable level of switching speed of its individual components due to the intrinsic delay, known as RC delay, characteristic of interconnect wires within the die. The resistance of the wire impedes the flow of charge, while the natural capacitance of the wire operates to store charge and therefore impede both the charge and discharge of the wire. Thus, the rate of change in the voltage along a wire when charging the wire to a logical high voltage level is limited by the resistance and capacitance of the wire, resulting in a delay between the time a logical high signal is driven onto the interconnect wire at the driven end of the interconnect wire and the time a receiving component receives the logical high signal at the receiving end of the interconnect wire. Likewise, the rate of change in the voltage along a wire when discharging the wire to a logical low voltage level is limited by the resistance and capacitance of the wire, thus also resulting in a delay between the time a logical low signal is driven onto the interconnect wire at the driven end of the interconnect wire and the time a receiving component receives the logical low signal at the receiving end of the interconnect wire.

Methods have been developed to accelerate the transmission of signals over interconnect wires. One method includes the use of repeater sensors. Repeater sensors are implemented and spaced along the interconnect wire such that each sensor senses and retransmits the signal at full strength to the next sensor across a shorter length of wire. This allows a signal to be retransmitted to the next sensor at full strength before the previous portion of wire has been fully charged. Thus, even though each individual portion of wire between sensors is identically subject to the same resistance and capacitance characteristics as the contiguous wire, the overall RC delay from the driver to the receiver sensor is reduced.

Another method for accelerating signal transmission across interconnect wires is via an interconnect wire tapering technique. With this technique, the interconnect wire is tapered such that it is wider at the driven end and narrower at the receiving end. The presence of a wider wire near the driven end results in less resistance to impede the flow of charge from the driven end towards the receiving end of the wire. However, wider wires have more capacitance. Fortunately, a wider wire near the driven end of the interconnect is less affected by the greater capacitance since the driver is in close proximity to the driven end. Accordingly, if the wire is tapered from wide at the driven end to narrow at the receiving end, the wire benefits from lower resistance on the driven portion of the wire and from lower capacitance at the receiving end. Consequently, a properly tapered interconnect is faster than a constant-width wire.

The techniques described above may not be practically implemented in many ICs. Interconnects are typically run in parallel with other interconnects; accordingly, the space required to implement repeater sensors along intervals of individual interconnects may not be available. Likewise, due to the added complexity of routing a tapered wire, the interconnect wire tapering technique requires more complex and therefore costly routing software and circuit simulation software.

Accordingly, a need exists for a simplified method for accelerating the transmission of signals across interconnect wires.

SUMMARY OF THE INVENTION

The present invention is a novel method and apparatus for improving the transmission speed of signals along interconnect wires of an integrated circuit. According to the technique of the invention, a minimum charge level is maintained on the wire when it is driven to a low voltage level and a maximum charge level is maintained on the wire when it is driven to a high voltage level. In accordance with one embodiment of the invention, the minimum and maximum charge levels are maintained on the wire using a pair of clamping circuits which limit the voltage level at the receiving end of the wire to a respective minimum voltage level and maximum voltage level, affecting the charge level on the entire wire to varying degrees. Accordingly, when the interconnect wire is driven to a high voltage level at a driven end of the wire, the charge level on the receiving end of the wire is already at a minimum level (higher than a conventional circuit), resulting in less delay time to charge the wire to a high voltage level. Conversely, when the interconnect wire is driven to a low voltage level at the driven end of the wire, the charge level on the receiving end of the wire is already capped to a maximum level (lower than a conventional circuit), which results in less delay time to drain the wire to a low voltage level.

In one embodiment, the clamping circuits are implemented using diodes. In another embodiment, the clamping circuits are implemented using diode-connected FETs.

The technique of the invention may be combined with other signal transmission accelerating techniques, such as wire tapering and signal repeating, to achieve even higher performance.

BRIEF DESCRIPTION OF THE DRAWING

The invention will be better understood from a reading of the following detailed description taken in conjunction with the drawing in which like reference designators are used to designate like elements, and in which:

FIG. 2 is a schematic diagram of a conventional interconnect line;

FIG. 4 is a schematic representation of the electrical characteristics of a wire;

FIG. 7 is a schematic diagram of an interconnect line in accordance with the invention;

DETAILED DESCRIPTION

A novel method and apparatus for accelerating the transmission of signals across interconnect wires of an integrated circuit is described in detail hereinafter. For a better understanding of the invention, a discussion of the operation of a conventional interconnect wire is first presented.

Figure 1:
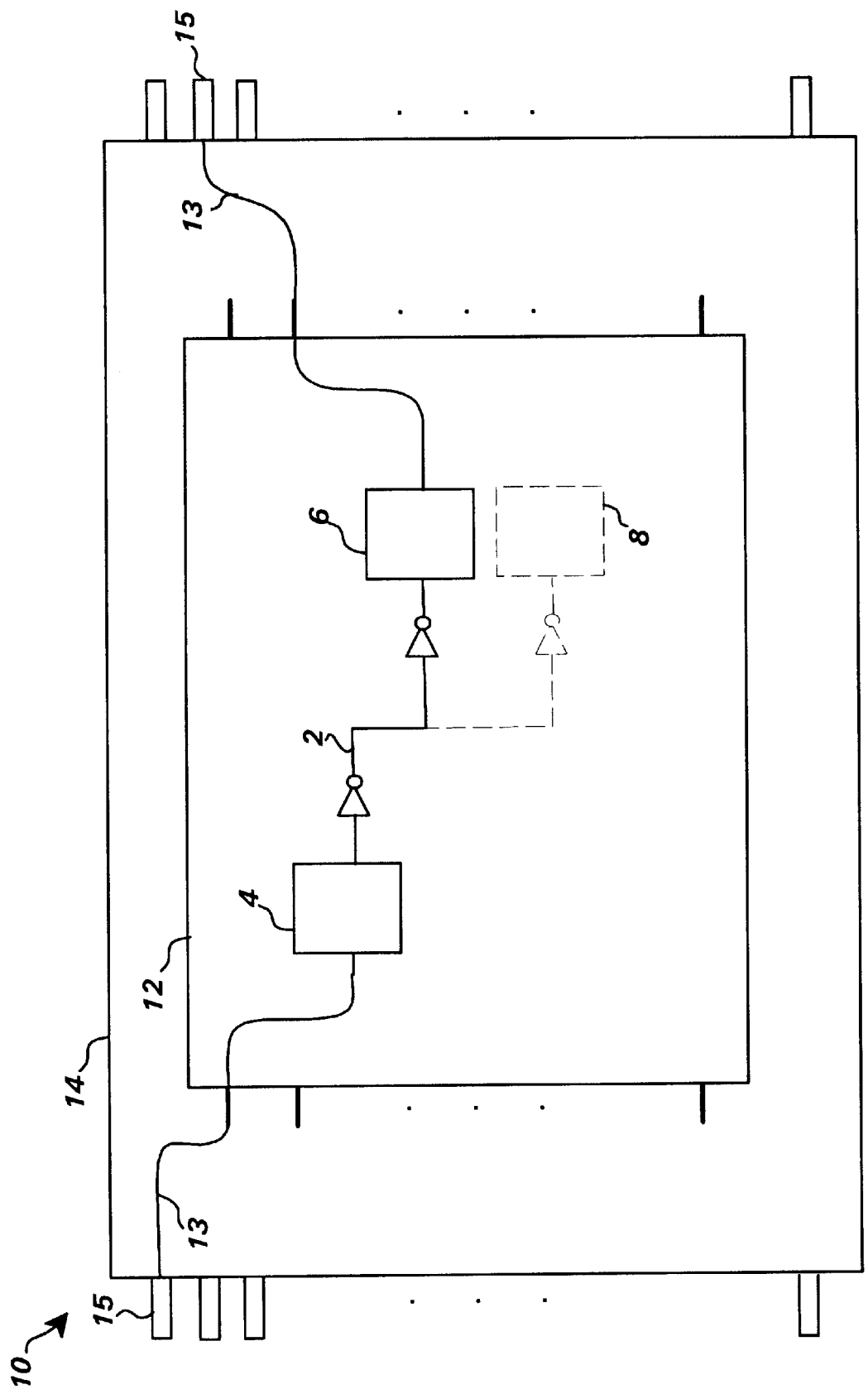
FIG. 1 is a block diagram of a conventional integrated circuit.

FIG. 1 is a block diagram of an integrated circuit (IC) 10. IC 10 comprises a silicon die 12 within a package 14. The functional elements of the IC 10 are implemented within die 12, and for a very large scale integration (VLSI) chip, typically include hundreds of thousands or millions of metal oxide semiconductor field effect transistor (MOSFET) components. Internal circuit signals are made available externally via wires 13 coupling die nodes to external package pins 15. Circuit components, or functional blocks implemented using a plurality of MOSFET components, communicate with one another within the chip via interconnect wires. For illustration, die 12 of FIG. 1 includes functional block 4 that outputs a signal to functional block 6 via interconnect wire 2. Although die 12 is shown with only two functional blocks 4, 6 and a single interconnect wire 2, a typical integrated circuit die will contain many such similar structures. Furthermore, each interconnect wire 2 may connect to more than one receiving functional block 8.

Functional blocks 4, 6, 8 communicate over interconnect wires 2, which may be unidirectional or bi-direction, via binary signals. For purposes of illustration, functional block 4 is shown as driving a signal over interconnect wire 2, where it is received by functional block 6. Accordingly, in the illustrated example, functional block 4 drives either a logical high (typically 3.3 volts for a 0.3 micron process) or a logical low (typically 0 volts) onto interconnect wire 2. To drive a signal onto wire 2 from one binary state to another, the output driver of functional block 4 must swing the wire—that is, it must either charge or discharge the wire.

The process of swinging a wire is not instantaneous. Due to the RC characteristics of the wire 2, a delay exists between the time functional block 4 drives an output signal onto interconnect wire 2 and the time that functional block 6 senses the change in the binary state of the wire.

Figure 3:
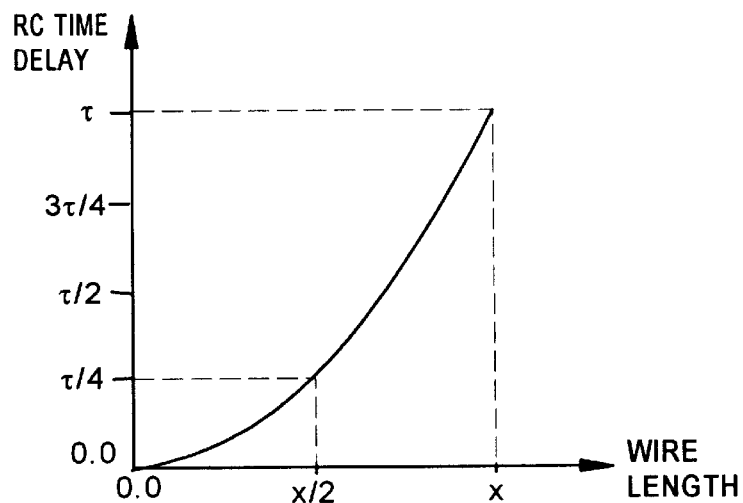
FIG. 3 is a graph illustrating the amount of RC delay versus the length of a wire.

A schematic diagram of a conventional interconnect line is illustrated in FIG. 2. Line 20 receives a signal IN. Preferably, a buffer circuit 22 boosts the signal IN to allow it to transition faster and provide greater current driving capability. The buffered signal is inverted by a driver circuit 23 and output onto wire 24 at driven end 21. The RC delay of wire 24 is related to its length, as illustrated by the graph shown in FIG. 3. Each unit 25 of length of wire 24 may be represented in a schematic model as shown in FIG. 4 by a resistance R and a capacitance C. Resistor R operates to impede the flow of charge, while capacitor C operates to store a level of charge. Thus, the rate of change of the amount of charge on wire 24 is limited by the resistance of the wire, resulting in a time delay t between the output of a signal IN received on one end 21 of wire 24 by driver circuit 23 and the sensing of the signal on the other end 29 by a receiver sensor 28.

Figure 5:
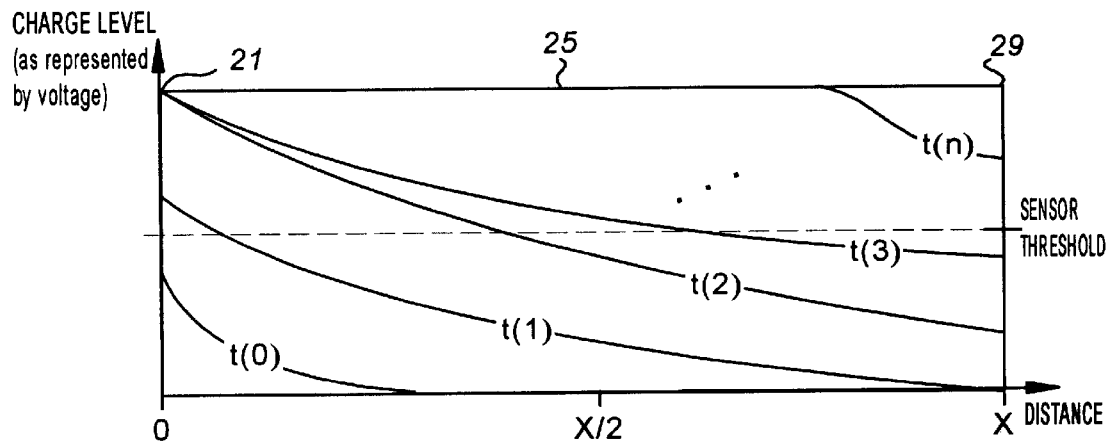
FIG. 5 is a graph illustrating the delay in charge buildup between the driven and receiving end of a wire during a low-to-high voltage swing.
Figure 6:
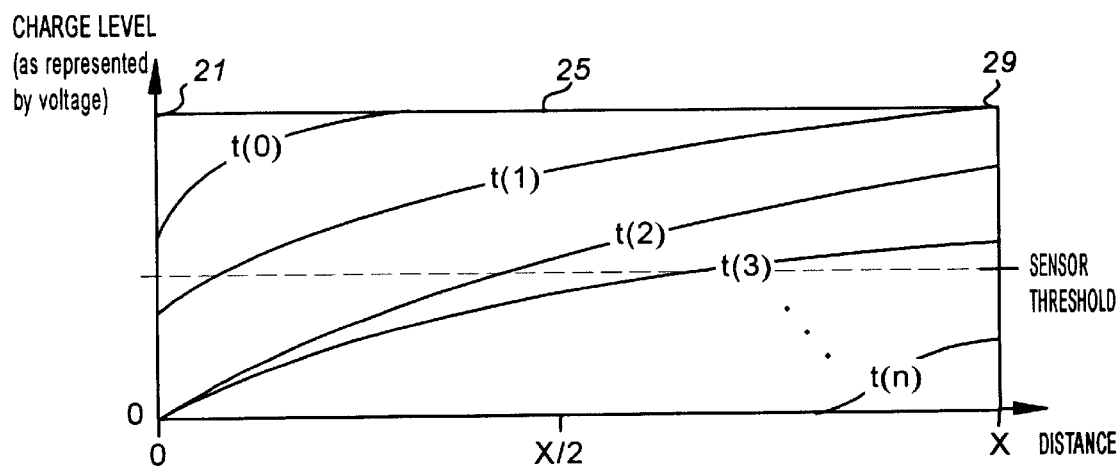
FIG. 6 is a graph illustrating the delay in charge draining between the driven and receiving end of a wire during a high-to-low voltage swing.

When driver circuit 23 performs a low-to-high swing on wire 24, the charge on wire 24 collects faster on the end 21 that is being driven (hereinafter "driven end 21") than on the far end 29 (hereinafter "receiving end 29") where the receiver sensor 28 resides. This is illustrated in FIG. 5, where wire 24 accumulates charge closer to driven end 21 than at receiving end 29 located distance X away. Likewise, as illustrated in FIG. 6, when driver circuit 23 performs a high-to-low swing, the charge on wire 24 of length X is drained faster on driven end 21 than on receiving end 29.

FIG. 7 is a schematic diagram of an interconnect line 40 that accelerates the transmission of signals across the wire from the driven end to the receiving end. Interconnect line 40 is identical to conventional interconnect line 20 except that it includes a clamping circuit 45 coupled to interconnect wire 44 near the receiving end 49 of line 40. In operation, interconnect line 40 receives a signal IN at the driven end of line 40. Preferably, signal IN is buffered by buffer circuit 42 to boost the signal. The buffered signal output by buffering device 42 is inverted and driven onto wire 44 by driver circuit 43. Clamping circuit 45 clamps the maximum and minimum voltage level at receiving end 49 of wire 44 to maintain a respective maximum and minimum charge level on the wire when wire 44 is driven to a respective high and low voltage level. Clamping circuit 45 is positioned in proximity to receiving sensor 48 at receiving end 49 of wire 44. Sensor 48 senses the signal present on wire 44 and outputs the sensed state of wire 44 as represented by signal OUT2. In the illustrative embodiment, sensor 48 is implemented with a CMOS inverter. To increase the switching speed of the interconnect line 40, the trip point of inverter 48 may be biased to flip states when the charge level reaches a certain threshold level so that it outputs the sensed state before the bus is fully charged. Biasing is accomplished by skewing the sizes of the NFET and PFET of the inverter 48.

Figure 8:
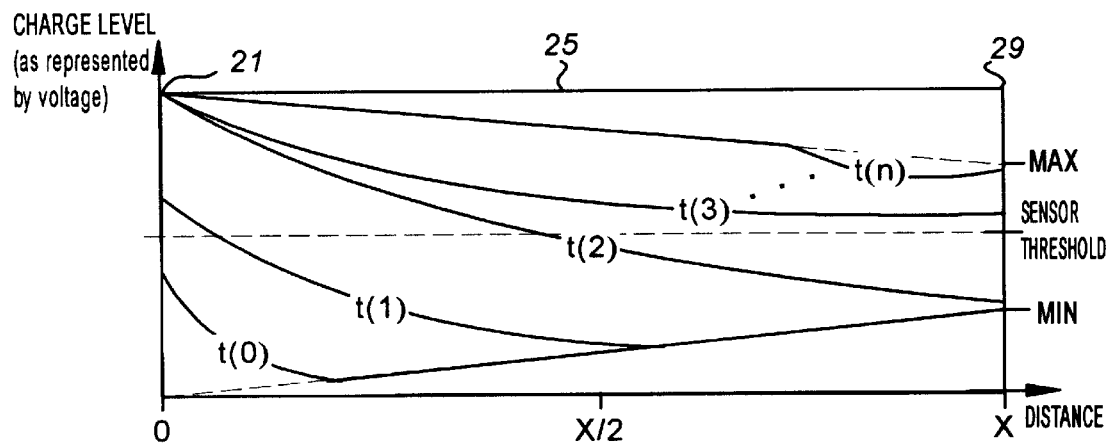
FIG. 8 is a graph illustrating the maintenance of a minimum level of charge on a wire and the resulting improved performance when draining charge on a wire during a high-to-low voltage swing.
Figure 9:
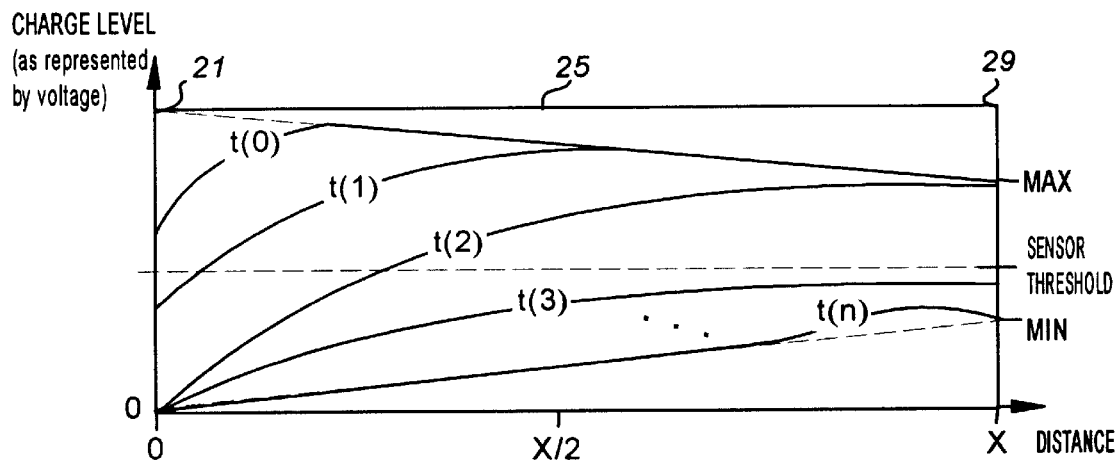
FIG. 9 is a graph illustrating the maintenance of a maximum level of charge on a wire and the resulting improved performance when charging a wire during a low-to-high voltage swing.

As previously described, clamping circuit 45 operates to maintain a minimum voltage gradient (i.e., a minimum charge level) on wire 44 when wire 44 is driven to a low voltage level and a maximum voltage level (i.e., maximum charge level) on wire 44 when wire 44 is driven to a high voltage level. The trip point of the receiver sensor 48 is designed to be between the minimum voltage level MIN and the maximum voltage level MAX. Clamping circuit 44 generally comprises a maximum voltage level clamp 46 and a minimum voltage level clamp 47. Minimum voltage level clamp 47 maintains a minimum charge level on wire 44 as illustrated in FIG. 8. Accordingly, when wire 44 is driven from low to high, a minimum amount of charge is already present on wire 44, which means that the driver need pump less charge onto wire 44, and therefore reduces the amount of time, to trip sensor 48. FIG. 9 illustrates the charge level on wire 44 as maintained by maximum voltage level clamp 46. When wire 44 is driven from high to low, a maximum amount of charge is allowed to be present on wire 44, which means that the driver need drain less charge from wire 44, and therefore reduces the amount of time, to trip sensor 48. Accordingly, the transmission of signals across interconnect wire 44 are essentially "accelerated", resulting in an overall increase in performance of the integrated circuit.

Figure 10:
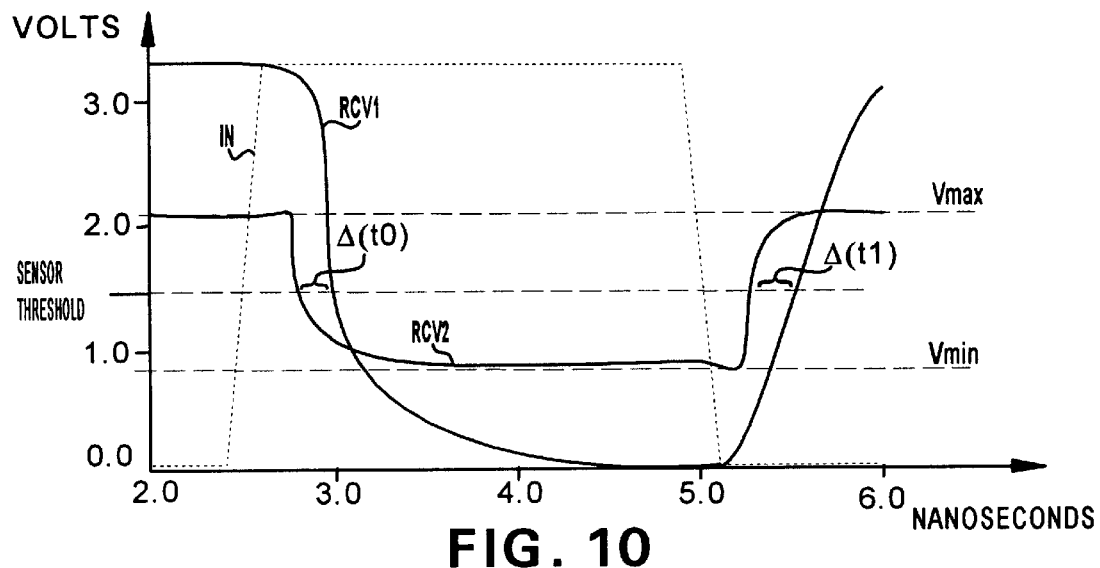
FIG. 10 is a plot illustrating signal transmission characteristics between the driven end and receiving end for both a conventional interconnect line and the interconnect line of the invention.

FIG. 10 is a graph of voltage level versus time plotting input signal IN, and the signal seen at the receiving ends of the wire, RCV1 of FIG. 2, and RCV2 of FIG. 7, for comparison. As illustrated, RCV2 is Δ(t0) faster than RCV1 when discharging the same wire, and is Δ(t1) nanoseconds faster when charging the wire (to the trip-point threshold).

Figure 11:
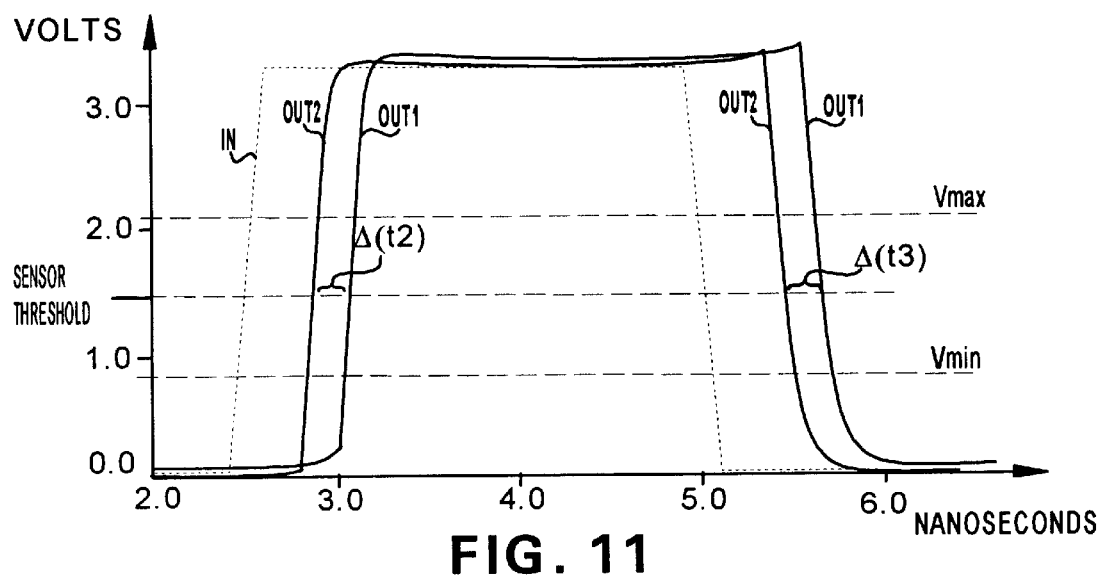
FIG. 11 is a plot illustrating the switching speed of both a conventional interconnect line and the interconnect line of the invention.

FIG. 11 is a graph of voltage level versus time plotting input signal IN, and sensor output signals OUT1 of FIG. 2, and OUT2 of FIG. 7, for comparison. As illustrated, OUT2 is Δ(t3) faster than OUT1 when discharging the same wire, and is Δ(t4) nanoseconds faster when charging the wire. Hence, the clamping technique of the invention accelerates the transmission of a signal across an interconnect wire, thereby allowing the receiving sensor to switch faster than that previously achievable in the prior art.

Figure 12A:
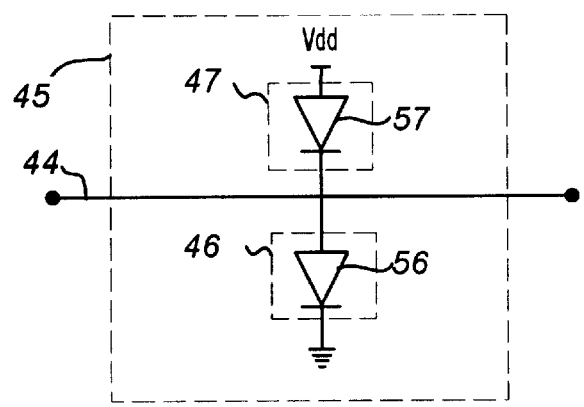
FIG. 12(a) is a schematic diagram of one embodiment of a clamping circuit in accordance with the invention.

Clamping circuit 45 of FIG. 7 may be implemented according to various embodiments. In one embodiment, shown in FIG. 12(a), maximum voltage level clamp 46 comprises a first diode element 56 and minimum voltage level clamp 47 comprises a second diode element 57. First diode element 56 has an anode (i.e., the p-doped side of a p-n junction) tied to wire 44 and a cathode (i.e., the n-doped side of a p-n junction) tied to ground. Second diode element 57 has an anode tied to a power source Vdd and a cathode tied to wire 44. Diode element 56 is implemented such that its threshold voltage is equal to the maximum threshold voltage. Diode element 57 is implemented such that its threshold voltage is equal to Vdd–$V_{min}$; that is, to the difference between Vdd and the minimum threshold voltage $V_{min}$. For example, if the minimum voltage level $V_{min}$ is set to 1 volt and the maximum voltage level $V_{max}$ is set to 2 volts in an integrated circuit based on a 3 volt Vdd power source, the voltage drop across each of diode element 56 and diode element 57 is 2 volts. As used herein, diode element means one or more conventional diodes connected in series. Diode elements 56 and 57 are illustrated in FIG. 12(a) as a single diode symbol; however, the single diode symbol is herein intended to imply any number of conventional diodes connected in series to achieve the desired voltage drop across them. For example, to achieve a voltage drop of 2.1 volts across a diode element, implicit in the single diode symbol is the implementation of three standard diodes, each having a threshold voltage of 0.7 volts, connected in series.

Figure 12B:
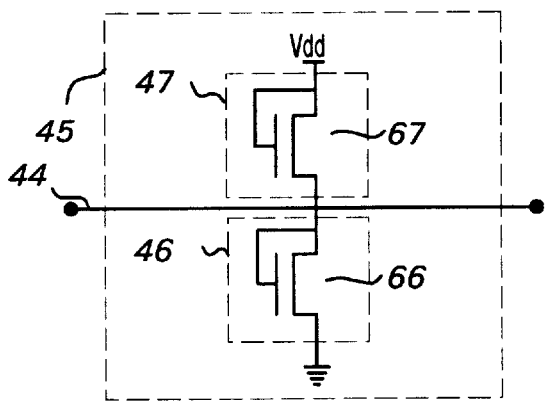
FIG. 12(b) is a schematic diagram of another embodiment of a clamping circuit in accordance with the invention.

Another embodiment of clamping circuit 45 is illustrated in FIG. 12(b). In this embodiment, minimum voltage level clamp 47 comprises a diode-connected NFET 67. The source and gate of NFET 67 are coupled to power source Vdd and the drain is coupled to wire 44. Maximum voltage level clamp 46 comprises diode-connected NFET 66. The source and gate of NFET 66 are coupled to wire 44 and its drain is coupled to ground. As will be appreciated by those skilled in the art, the appropriate diode drop across diode connected NFETs 66 and 67 may be achieved via appropriate FET sizing, or alternatively, via various series and parallel combinations of a plurality of diode-connected FETs, which are known equivalents in the art.

Figure 12C:
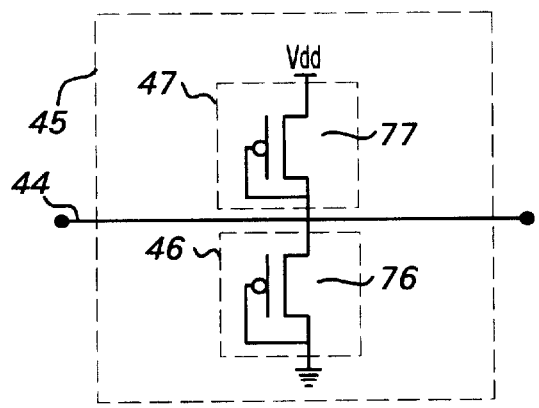
FIG. 12(c) is a schematic diagram of yet another embodiment of a clamping circuit in accordance with the invention.

Yet another embodiment of clamping circuit 45 is illustrated in FIG. 12(c). In this embodiment, minimum voltage level clamp 47 comprises a diode-connected PFET 77. The source of PFET 77 is coupled to power source Vdd and the gate and drain are coupled to wire 44. Maximum voltage level clamp 46 comprises diode-connected PFET 76. The source of PFET 76 is coupled to wire 44 and its gate and drain are coupled to ground. As will be appreciated by those skilled in the art, the appropriate diode drop across diode connected PFETs 76 and 77 may be achieved via appropriate FET sizing, or alternatively, via various series and parallel combinations of a plurality of diode-connected FETs, which are known equivalents in the art.

Figure 13A:
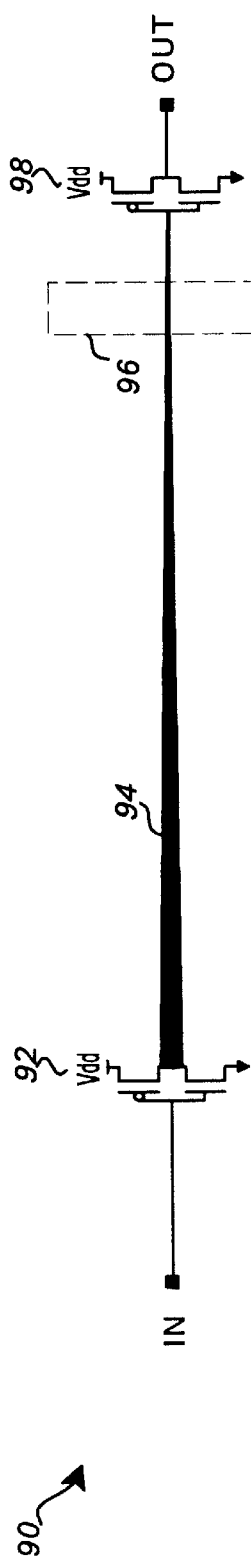
FIG. 13(a) is a schematic diagram of a tapered wire interconnect line in accordance with the invention.

The present invention may be combined with signal transmission acceleration techniques described in the background section to further increase the transmission speed of interconnect wires. FIG. 13(a) illustrates an interconnect line 90 in which a driver 92 drives the driven end of wire 94 that includes the clamping circuit 96 in accordance with the invention in proximity to the receiver sensor 98 at the receiving end of wire 94. In this embodiment, wire 94 is tapered such that the driven end is wider and the receiving end is narrower.

Figure 13B:
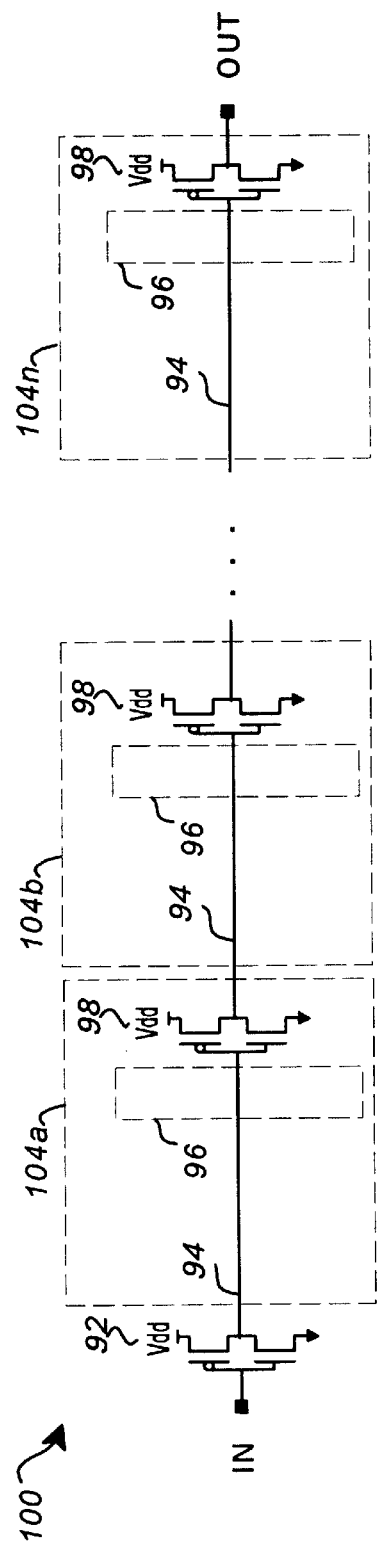
FIG. 13(b) is a schematic diagram of a repeater interconnect line in accordance with the invention.
Figure 13C:
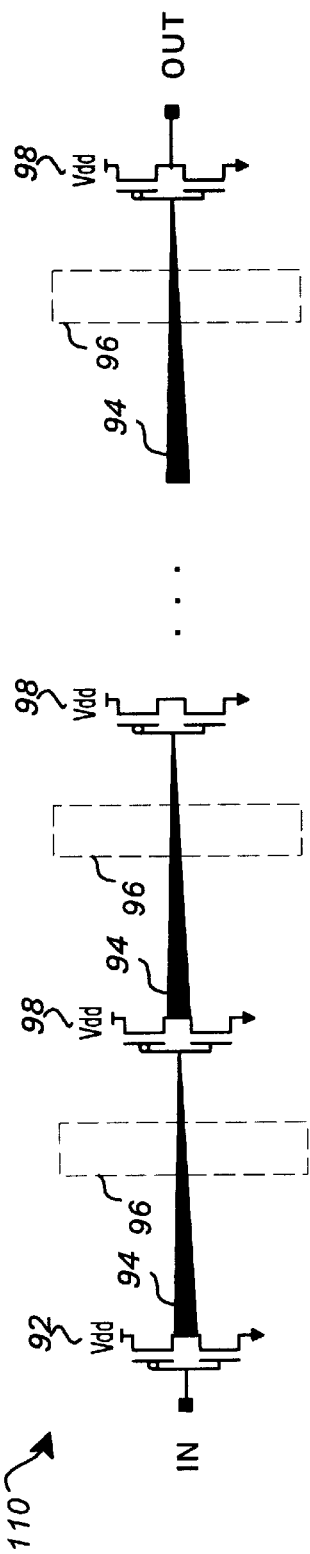
FIG. 13(c) is a schematic diagram of a tapered wire repeater interconnect line in accordance with the invention.

FIG. 13(b) illustrates an alternative combination of the signal transmission acceleration techniques in which interconnect line 100 is driven by driver circuit 92 and is formed by a plurality of sections 104a, 104b, . . . , 104n, each including a respective instance of a clamping circuit 96 in accordance with the invention placed along a wire 94 in proximity to a repeater sensor 98. This technique combines the signal transmission acceleration technique of the invention with the use of repeater sensors to improve the performance of the interconnect line. FIG. 13(c) combines all three techniques by implementing wire 94 of FIG. 13(b) with a tapered wire in which the driven end of wire 94 is wider and the receiving end of wire 94 is narrower.

Although the invention has been described in terms of the illustrative embodiments, it will be appreciated by those skilled in the art that various changes and modifications may be made to the illustrative embodiments without departing from the spirit or scope of the invention. It is intended that the scope of the invention not be limited in any way to the illustrative embodiment shown and described.

What is claimed is:

1. An apparatus for accelerating the transmission of a signal across an interconnect wire of an integrated circuit, said interconnect wire comprising a driven end on which a signal is driven and a receiving end on which said signal is received, comprising:

a first clamp circuit in proximity to said receiving end, said first clamp circuit clamping said receiving end of said interconnect wire to a maximum voltage level when said interconnect wire is driven to a high voltage level at said driven end, said maximum voltage level less than said high voltage level; and a second clamp circuit in proximity to said receiving end, said second clamp circuit clamping said receiving end of said interconnect wire to a minimum voltage level when said interconnect wire is driven to a low voltage level at said driven end, said minimum voltage level greater than said low voltage level; and a sensor coupled to said wire;

wherein said first clamp circuit and said second clamp circuit maintain a voltage gradient between said driven end and said receiving end so long as said driven end is actively driven.

2. An apparatus in accordance with claim 1, wherein:

said first clamp circuit comprises a first diode element, said first diode element having an anode coupled to said interconnect wire and a cathode coupled to a circuit ground; and said second clamp circuit comprises a second diode element, said second diode element having an anode coupled to a power source and a cathode coupled to said interconnect wire.

3. An apparatus in accordance with claim 1, wherein:

said first clamp circuit comprises a first n-type transistor, said first n-type transistor having a gate and a drain coupled to said interconnect wire and a source coupled to a circuit ground; and said second clamp circuit comprises a second n-type transistor, said second n-type transistor having a gate and a drain coupled to a power source and a source coupled to said interconnect wire.

4. An apparatus in accordance with claim 1, wherein:

said first clamp circuit comprises a first p-type transistor, said first p-type transistor having a source coupled to said interconnect wire and a gate and a drain coupled to a circuit ground; and said second clamp circuit comprises a second p-type transistor, said second p-type transistor having a source coupled to a power source and a gate and a drain coupled to said interconnect wire.

5. An apparatus in accordance with claim 1, wherein:

said first clamp circuit and said second clamp circuit are implemented in closer proximity to said receiving end than said driven end.

6. An interconnect wire, comprising:

a wire, said wire comprising a driven end on which a signal is driven and a receiving end on which said signal is received;

a first clamp circuit in proximity to said receiving end of said wire, said first clamp circuit maintaining a maximum voltage level on said receiving end of said wire when said wire is driven to a high voltage level at said driven end, said maximum voltage level less than said high voltage level; and a second clamp circuit in proximity to said receiving end of said wire, said second clamp circuit maintaining a minimum voltage level on said receiving end of said wire when said wire is driven to a low voltage level at said driven end, said minimum voltage level greater than said low voltage level; and a sensor coupled to said receiving end of said wire;

wherein said first clamp circuit and said second clamp circuit maintain a voltage gradient between said driven end and said receiving end so long as said driven end is actively driven.

7. An interconnect wire in accordance with claim 6, wherein:

said first clamp circuit comprises a first diode element, said first diode element having an anode coupled to said interconnect wire and a cathode coupled to a circuit ground; and said second clamp circuit comprises a second diode element, said second diode element having an anode coupled to a power source and a cathode coupled to said interconnect wire.

8. An interconnect wire in accordance with claim 6, wherein:

said first clamp circuit comprises a first transistor, said first transistor having a gate and a source coupled to said interconnect wire and a drain coupled to a circuit ground; and said second clamp circuit comprises a second transistor, said second transistor having a gate and a source coupled to a power source and a drain coupled to said interconnect wire.

9. An interconnect wire in accordance with claim 6, wherein:

said first clamp circuit comprises a first transistor, said first transistor having a source coupled to said interconnect wire and a gate and a drain coupled to a circuit ground; and said second clamp circuit comprises a second transistor, said second transistor having a source coupled to a power source and a gate and a drain coupled to said interconnect wire.

10. An interconnect wire in accordance with claim 6, wherein said wire is tapered such than said driven end of said wire is wider than said receiving end of said wire.

11. An interconnect wire in accordance with claim 10, wherein:

said wire comprises a plurality of wire sections each of which comprises a wire section driven end on which a signal is driven, wire section receiving end on which said signal is received, and an identical instance of said first clamp circuit and said second clamp circuit coupled to its respective wire section receiving end.

12. An interconnect wire in accordance with claim 6, wherein:

said wire comprises a plurality of wire sections each of which comprises a wire section driven end on which a signal is driven, wire section receiving end on which said signal is received, and an identical instance of said first clamp circuit and said second clamp circuit coupled to its respective wire section receiving end.

13. An apparatus in accordance with claim 6, wherein:

said first clamp circuit and said second clamp circuit are implemented in closer proximity to said receiving end than said driven end.

14. A method for accelerating the trans mission of signals across an interconnect wire of an integrated circuit, said interconnect wire comprising a driven end on which a signal is driven and a receiving end on which said signal is received, said method comprising:

maintaining a minimum voltage level on said receiving end of said interconnect wire when said driven end of said interconnect wire is driven to a low voltage level, said maximum voltage level less than said high voltage level; and maintaining a maximum voltage level on said interconnect wire when said interconnect wire is driven to a high voltage level, said minimum voltage level greater than said low voltage level;

thereby maintaining a voltage gradient between said driven end and said receiving end so long as said driven end is actively driven.

15. A method in accordance with claim 14, wherein:

said maintaining a minimum voltage level comprises clamping said receiving end of said interconnect wire to said minimum voltage level; and said maintaining a maximum voltage level comprises clamping said receiving end of said interconnect wire to said maximum voltage level.

16. A method in accordance with claim 14, comprising: tapering said interconnect wire such that said driven end of said interconnect wire is wider than said receiving end of said interconnect wire.

17. A method in accordance with claim 16, comprising: partitioning said interconnect wire into a plurality of interconnect wire sections; and performing said method for each of said interconnect wire sections.

18. A method in accordance with claim 14, comprising:

partitioning said interconnect wire into a plurality of interconnect wire sections; and performing said method for each of said interconnect wire sections.

19. An interconnect wire in accordance with claim 14, wherein:

each said plurality of wire sections comprises a sensor coupled to its respective wire section receiving end.

* * * * *